US012702013B2

(12) United States Patent
Kudtarkar et al.

(10) Patent No.: US 12,702,013 B2
(45) Date of Patent: Aug. 4, 2026

(54) ANTENNA PACKAGE HAVING A LAMINATE SUBSTRATE

(71) Applicant: Analog Devices International Unlimited Company, Limerick (IE)

(72) Inventors: Santosh Kudtarkar, Ayer, MA (US); Islam A. Eshrah, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 589 days.

(21) Appl. No.: 18/126,882

(22) Filed: Mar. 27, 2023

(65) Prior Publication Data

US 2024/0332225 A1    Oct. 3, 2024

(51) Int. Cl.
*H10W 44/20* (2026.01)
*H01Q 1/38* (2006.01)
(Continued)

(52) U.S. Cl.
CPC .............. *H10W 44/20* (2026.01); *H01Q 1/38* (2013.01); *H10W 74/00* (2026.01); *H10W 90/724* (2026.01)

(58) Field of Classification Search
CPC ..... H01L 23/3128; H01L 23/66; H01L 25/16; H01L 24/16; H01L 23/538; H01L 23/49816; H01L 25/043; H01L 23/5384; H01L 25/18; H01L 23/28; H01L 24/97; H01L 21/311; H01L 21/3105; H01L 23/552; H01L 21/31056; H01L 25/0657;

H01L 25/165; H01L 24/96; H01L 25/0655; H01L 23/5383; H01L 2924/18161; H01L 24/48; H01L 21/4853; H01L 23/49811;
(Continued)

(56) References Cited

U.S. PATENT DOCUMENTS 6,441,475  B2    8/2002  Zandman et al.
6,723,585  B1    4/2004  Tu et al.
(Continued)

OTHER PUBLICATIONS

Extended European Search Report for Application No. 24166065.3, dated Aug. 12, 2024, 9 pages.
(Continued)

*Primary Examiner* — Mouloucoulaye Inoussa
(74) *Attorney, Agent, or Firm* — Knobbe, Martens, Olson & Bear, LLP

(57) ABSTRACT

A radio frequency stacked die assembly can include a laminate substrate with a layer of conductive traces between a first plurality of laminate layers. The stacked die assembly can include surface mount antenna packages mounted to an exterior surface of the substrate, each antenna package including a radio frequency patch antenna embedded within a second plurality of laminate layers. The stacked die assembly further includes one or more surface mount passive devices and a flip chip semiconductor die mounted to opposite sides of the substrate. A plurality of solder balls are provided for mounting the substrate to a printed circuit board. The flip chip die, radio frequency antennas, passive devices, and solder balls are connected by the layer of conductive traces. Separating the patch antenna(s) from the substrate and into an antenna package simplifies construction and testing of the stacked die assembly, and can yield improved antenna performance.

20 Claims, 5 Drawing Sheets

(51) Int. Cl.
  *H10W 74/00* (2026.01)
  *H10W 90/00* (2026.01)

(58) Field of Classification Search
  CPC ..... H01L 21/56; H01L 23/31; H01L 25/0652;
    H01L 25/50; H01L 21/568; H01L
    21/6835; H01L 23/3107; H01L 21/561;
    H01L 2924/15321; H01L 2224/16227;
    H01L 2224/48227; H01L 2924/181;
    H01L 2223/6677; H01L 2924/19106;
    H01L 2224/92225; H01L 2924/19042;
    H01L 2224/73253; H01L 2224/17181;
    H01L 2225/06513; H01L 2224/32145;
    H01L 2225/06517; H01L 2225/0651;
    H01L 2224/73204; H01L 2224/48091;
    H01Q 1/38; H01Q 21/065; H01Q 1/2283;
    H10F 77/50
  See application file for complete search history.

(56) References Cited

U.S. PATENT DOCUMENTS

| | | | |
|---|---|---|---|
| 7,411,281 | B2 | 8/2008 | Zhang |
| 7,429,752 | B2 | 9/2008 | Steegen et al. |
| 7,489,025 | B2 | 2/2009 | Chen et al. |
| 7,541,644 | B2 | 6/2009 | Hirano et al. |
| 7,619,303 | B2 | 11/2009 | Bayan |
| 7,745,927 | B2 | 6/2010 | Ryan et al. |
| 7,911,059 | B2 | 3/2011 | Cheng et al. |
| 7,998,791 | B2 | 8/2011 | Chong et al. |
| 9,190,732 | B2 | 11/2015 | Fujii et al. |
| 9,337,526 | B2 | 5/2016 | Hong et al. |
| 9,985,346 | B2 | 5/2018 | Baks et al. |
| 10,263,476 | B2 | 4/2019 | Leabman |
| 10,431,892 | B2 | 10/2019 | Garcia et al. |
| 10,797,405 | B1 | 10/2020 | Baek et al. |
| 10,938,091 | B1 | 3/2021 | Cho et al. |
| 11,222,834 | B2 | 1/2022 | Kraft et al. |
| 11,233,018 | B2 | 1/2022 | Dalmia et al. |
| 11,870,156 | B2 | 1/2024 | Eshrah et al. |
| 2006/0138622 | A1 | 6/2006 | Lu et al. |
| 2008/0290502 | A1 | 11/2008 | Kutlu |
| 2008/0315390 | A1 | 12/2008 | Kuhmann et al. |
| 2011/0037170 | A1* | 2/2011 | Shinohara ............. H01L 21/565 |
| | | | 257/737 |
| 2014/0293529 | A1 | 10/2014 | Nair et al. |
| 2017/0077022 | A1* | 3/2017 | Scanlan .................. H01L 24/97 |
| 2018/0323170 | A1* | 11/2018 | Kim ..................... H01L 21/4853 |
| 2019/0067207 | A1* | 2/2019 | Hu ....................... H01L 23/3192 |
| 2019/0214355 | A1* | 7/2019 | Nishikawa .............. H01L 23/66 |
| 2020/0043821 | A1* | 2/2020 | Choi ....................... H01L 24/17 |
| 2020/0052404 | A1 | 2/2020 | Eid et al. |
| 2020/0161252 | A1* | 5/2020 | Yang ...................... H01L 21/568 |
| 2020/0161413 | A1 | 5/2020 | Kirkman |
| 2020/0259269 | A1 | 8/2020 | Kim et al. |
| 2021/0091017 | A1 | 3/2021 | Yeon et al. |
| 2021/0175178 | A1* | 6/2021 | We ........................... H01L 24/20 |
| 2021/0280507 | A1* | 9/2021 | Aldrete .............. H01L 23/3128 |
| 2021/0375707 | A1* | 12/2021 | Teixeira De Queiros ................... |
| | | | H01L 25/18 |
| 2022/0013882 | A1 | 1/2022 | Choi et al. |
| 2022/0028838 | A1* | 1/2022 | Siomkos .............. H01L 25/043 |
| 2022/0359353 | A1 | 11/2022 | Tham et al. |
| 2023/0024260 | A1 | 1/2023 | Choi et al. |
| 2023/0067475 | A1 | 3/2023 | Cho et al. |
| 2024/0038743 | A1* | 2/2024 | Zhang ................... H01L 25/162 |

OTHER PUBLICATIONS

"BGA 30L—16BALL/14 STUD, MOSFET BGA, 4.0 X 3.5MM, ATALA (Active)," Fairchild Semiconductor, https://web.archive.org/web/20121023191558/http://www.fairchildsemi.com/package/packageDetails.html?id=PN_SMBGA-005, 2012 (printed Apr. 17, 2024), 2 pages.

"Definitions of Common Parts," Advanced Assembly, Jul. 14, 2020, 3 pages.

Kim, Jinbum et al., "Multi-Flip Chip on Lead Frame Overmolded IC package: A Novel Packaging Design to Achieve High Performance and Cost Effective Module Package," 2005 Electronic Components and Technology Conference, 2005, pp. 1819-1821.

Tengh, Alfred et al., "Ultra-small 0201 passive device process optimization and it's effective inspection," 2006 8th Electronics Packaging Technology Conference, Singapore, 2006, pp. 518-524.

* cited by examiner

MODULE

402

404

406

408

SWITCH

401

404

PA

408

406

130

120

400

4B

4B

ANTENNA PACKAGE HAVING A LAMINATE SUBSTRATE

BACKGROUND

Field of the Invention

The invention generally relates to the field of communications, particularly radio frequency electronics.

Description of the Related Art

A face-to-face stacked die configuration describes two or more devices assembled face-to-face wherein a smaller die is nested within an I/O-free area of a larger die. The smaller (daughter) die can be a flip chip mounted onto a face of the larger (mother) die so as not to interfere with the mother's surrounding flip chip bump pattern. The face-to-face stacked die configuration can be mounted onto a substrate as a chip-scale package (CSP) or ball grid array (BGA). It can also be mounted within a lead frame package or directly onto a printed circuit board (PCB) as a wafer-level chip-scale package (WLCSP).

SUMMARY

In one aspect, the techniques described herein relate to a stacked die assembly, including: a laminate substrate including a layer of conductive traces and a first plurality of laminate layers, the laminate substrate having a first exterior surface and a second exterior surface opposite the first exterior surface; one or more surface mount antenna packages mounted to the first exterior surface of the substrate, each antenna package including a radio frequency antenna embedded within a second plurality of laminate layers; one or more surface mount passive devices mounted to the first exterior surface of the substrate; a flip chip semiconductor die mounted to the second exterior surface of the substrate; a plurality of solder balls provided on the second exterior surface of the substrate for mounting the stacked die assembly; and an overmold provided on the second exterior surface of the substrate such that the overmold envelops a periphery of the flip chip die and the plurality of solder balls; wherein the flip chip die, radio frequency antennas, passive devices, and solder balls are connected by the layer of conductive traces and a plurality of vias; and wherein the laminate substrate does not include a radio frequency antenna.

In another aspect, the techniques described herein relate to a surface mount antenna package including: a plurality of laminate layers; and a conductive layer forming a radio frequency antenna embedded within the plurality of laminate layers; wherein the antenna package is a ball grid array or land grid array package; and wherein the radio frequency antenna is a patch antenna connected to solder pads on a lower layer of the plurality of laminate layers by one or more conductive vias.

In yet another aspect, the techniques described herein relate to a method of manufacturing a stacked die assembly, including: providing a laminate substrate including a layer of conductive traces and a first plurality of laminate layers, the laminate substrate having a first exterior surface and a second exterior surface opposite the first exterior surface; screening solder paste onto a plurality of solder pads on the first exterior surface of the substrate; soldering a surface mount antenna package onto the solder pads of the first exterior surface of the substrate, the antenna package including a radio frequency antenna embedded within a second plurality of laminate layers; soldering one or more surface mount passive devices onto the solder pads of the first exterior surface of the substrate; reflow soldering the antenna package and passive devices to the first exterior surface of the substrate; protecting the first exterior surface of the substrate with a cover or casing; mounting a flip chip semiconductor die on the second exterior surface of the substrate such that a plurality of copper pillar bumps of the flip chip die are in contact with corresponding solder pads of the substrate; forming an overmold over the second exterior surface of the substrate such that the overmold envelops a periphery of the flip chip die; stripping away a part of the overmold to expose an exterior surface of the flip chip die; stripping away a part of the overmold to expose a plurality of solder pads on a periphery of the second exterior surface of the substrate; applying a layer of flux over the second exterior surface of the substrate; screening solder paste onto the plurality of solder pads on the periphery of the second exterior surface of the substrate; and reflow soldering a plurality of solder balls onto the plurality of solder pads on the periphery of the second exterior surface of the substrate.

BRIEF DESCRIPTION OF THE DRAWINGS

FIG. 4A is a schematic diagram of one embodiment of a packaged module implementing a flip chip stacked die assembly; and FIG. 4B is a schematic diagram of a cross-section of the packaged module of FIG. 4A taken along the lines 4B-4B.

DETAILED DESCRIPTION

Figure 1A:
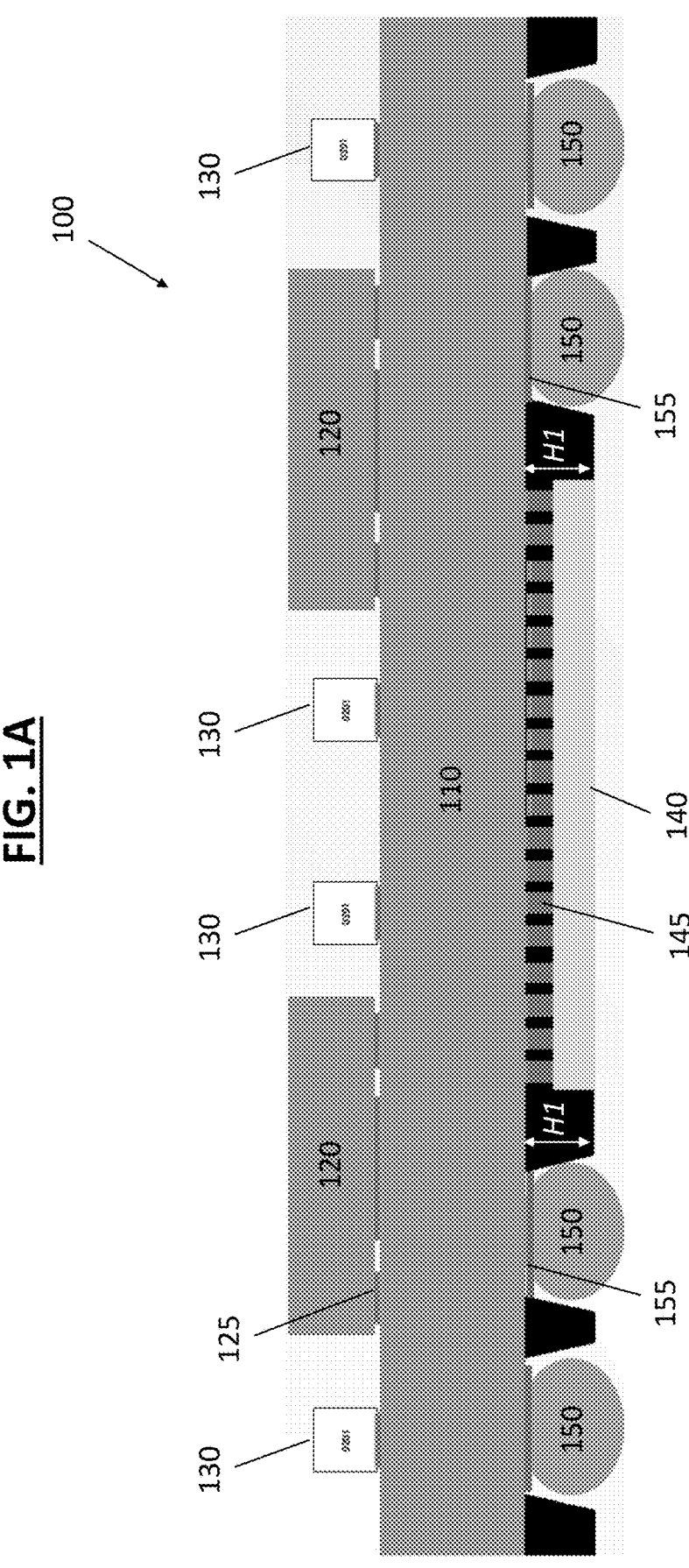
FIG. 1A is an elevational side view of one embodiment of a flip chip stacked die assembly implementing an antenna package as described herein.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Radio frequency (RF)-enabled devices can include one or more RF stacked die assemblies. A flip chip stacked die assembly can include a printed circuit board (PCB) substrate, a flip chip semiconductor die mounted to the PCB substrate, and one or more PCB traces forming an antenna element within the PCB substrate. The flip chip die can include one or more RF modules, such as a RF front-end module (FEM), a RF transceiver, or another RF integrated circuit (RFIC) communicatively connected to the PCB traces. The RF module(s) of the flip chip die controls transmission (TX) and/or receiving (RX) operation of the antenna element to provide wireless connectivity of the RF-enabled device.

The present disclosure relates to an antenna package of the stacked die assembly. The antenna package includes antenna elements provided on one or more laminate layers. The antenna package is not a semiconductor device, and can be manufactured in volume relatively inexpensively. Antenna packages may be interchangeable between multiple stacked die assemblies depending on their application. The antenna package can be a land grid array (LGA) or ball grid array (BGA) package for mounting to a surface of a PCB substrate. The discrete antenna package(s) provide additional antenna height over the substrate and can improve wireless connectivity of the stacked die assembly. The antenna package(s) can also simplify manufacturing of the stacked die assembly by replacing antenna elements in the PCB substrate, allowing each antenna element of the package to be individually tested or replaced.

Embodiments of an Antenna Package

Referring initially to FIG. 1A, a stacked die assembly 100 implementing an antenna package 120 is shown. The stacked die assembly 100 includes a laminate substrate 110, one or more surface mount antenna packages 120 mounted to an upper exterior surface of the substrate 110, and a flip chip semiconductor die 140 mounted to a lower exterior surface of the substrate 110. The upper exterior surface of the substrate can further include a number of radio frequency (RF) passive devices 130, preferably surface mount technology (SMT) devices including resistors, capacitors, inductors, or diodes. Variously sized RF passive devices 130 (such as 0201-type, 0402-type, 0603-type, 0805-type, or 01005-type devices) can also be used depending on a footprint of the stacked die assembly 100 and surface area of the antenna package 120.

The stacked die assembly 100 can be formed by soldering components to a number of solder pads provided on the upper exterior surface and lower exterior surface of the laminate substrate 110. Components such as the SMT antenna packages 120 and passive devices 130 can be individually soldered to the substrate 110, or the substrate can be prepared for reflow soldering to allow one or both exterior surfaces to be populated with components simultaneously. In certain embodiments, the RF passive devices 130 and/or flip chip die 140 can be reflow soldered to the laminate substrate 110 in a first step, and the one or more antenna packages 120 are mounted to the substrate 110 in a second step. This can allow for greater flexibility in manufacturing various stacked die assemblies 100 because each antenna package 120 is interchangeable and can be among the last components soldered to the substrate 110. A defective antenna package 120 can also be identified and replaced before it is mounted to the assembly 100, providing higher manufacturing yields.

The lower exterior surface of the laminate substrate 110 can be populated with the flip chip semiconductor die 140 and a plurality of solder balls 150. The flip chip die 140 is soldered, such as by reflow soldering, to pads on the lower exterior surface of the substrate 110. A plurality of conductive bumps 145 (e.g., copper pillar bumps) are provided on the flip chip die 140, which is then mounted to an underside of the substrate 110 by the lower exterior surface. The flip chip die 140 can be thinned (e.g., by back grinding) to provide a planar surface of the die 140 and a consistent die height H1 relative to the lower exterior surface of the substrate 110.

The plurality of solder balls 150 are provided on corresponding solder pads 155 at a periphery of the flip chip die 140. The lower exterior surface of the substrate 110 can have a dielectric overmold formed around the solder balls 150, including an underfill between the flip chip die 140 and substrate 110. The overmold envelops the periphery of the flip chip die 140 and each of the plurality of solder balls 150. Laser ablation or grinding can strip away an excess portion of the overmold above the die height H1, exposing the solder balls 150 and the planar surface of the flip chip die 140, allowing the stacked die assembly 100 to be mounted. The stacked die assembly 100 can be a ball grid array (BGA) package configured to be mounted to a printed circuit board (PCB) by reflow of the solder balls 150. When the assembly 100 is mounted to a PCB, the flip chip die 140 is covered by the laminate substrate 110 which can provide a degree of RF shielding. The planar surface of the flip chip die 140 can also be in contact with a thermal interface material (TIM) for efficient heat transfer away from the die 140.

The die height H1 of the flip chip die 140 is preferably less than about 100 micrometers. A pitch of the solder balls 150 can be reduced for higher density of conductors of the BGA package. For example, the pitch between each of the solder balls 150 can be less than about 500 micrometers, and a width of each solder ball 150 can be less than about 250 micrometers. In certain embodiments, the die height H1 of the flip chip die 140 is further reduced (e.g., by back grinding) to allow individual solder balls 150 to be made narrower. Accordingly, the stacked die assembly 100 with narrower solder balls 150 can have a reduced BGA pitch and higher density of conductors. This can enable the stacked die assembly to support more complex flip chip dies 140 and antenna packages 120 without a corresponding increase in the size of the footprint of the laminate substrate 110.

Figure 1B:
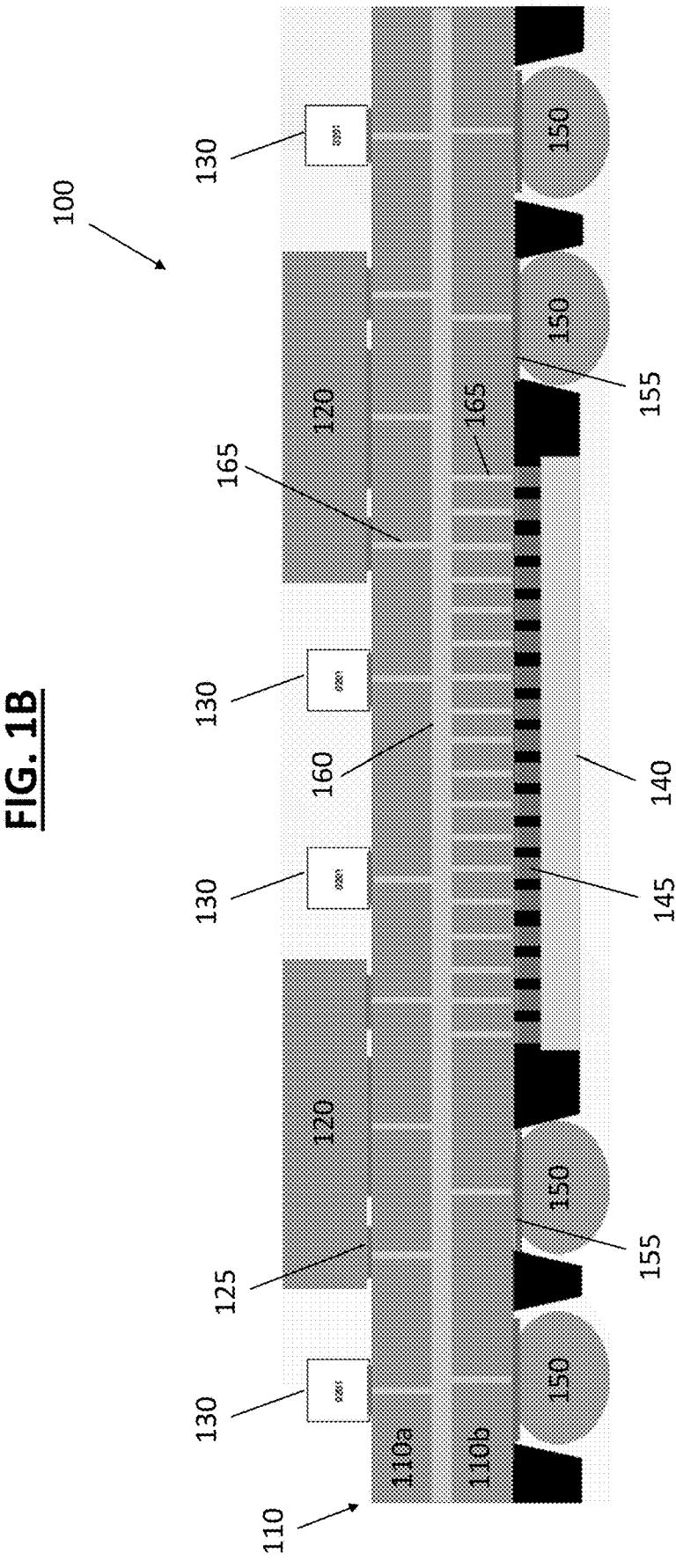
FIG. 1B is a cross-sectional elevational side view of the stacked die assembly of FIG. 1A.

FIG. 1B shows a cross-sectional view of the laminate substrate 110 of the stacked die assembly 100 of FIG. 1A. The laminate substrate 110 includes at least a first laminate layer 110a and a second laminate layer 110b. Between the laminate layers, a conductive layer of one or more PCB traces 160 is formed to connect a plurality of vias 165 extending throughout layers of the laminate substrate 110. Various solder pads 125 and 155 on the upper exterior surface and the lower exterior surface of the substrate 110 are electrically and communicatively connected by the PCB traces 160 and plurality of vias 165.

For case of illustration, the embodiment of FIG. 1B is a dual-layer laminate substrate 110 with a single conductive layer of PCB traces 160. However, those skilled in the art will appreciate that the substrate 110 can include additional laminate and conductive layers to provide adequate connectivity for each of the components of the stacked die assembly 100. (Although from the perspective of FIG. 1B it appears that every one of the vias 165 is connected to a same PCB trace 160, the conductive layer actually includes multiple PCB traces 160 located in the same plane.) Preferably, the laminate substrate 110 is a six or eight-layer substrate with one or more PCB traces 160 located between each layer. Vias 165 can be provided in each substrate layer (including blind vias, buried vias, and/or through vias) to form an electrical connection between various components soldered to a plurality of solder pads 125 on the upper exterior surface and solder pads 155 on the lower exterior surface of the substrate 110.

In some cases, the PCB traces 160 and vias 165 can act as a pass-through to connect components directly to a mounted PCB. For example, one or more pillar bumps 145 of the flip chip die 140 can be mapped directly to the solder balls 150 to enable input/output operation of the die 140 by way of the BGA conductors. As will be discussed herein, the flip chip die 140 is also connected to the antenna package(s) 120 and RF passive devices 130 to enable wireless connectivity of the stacked die assembly 100. Certain solder pads 155 and solder balls 150 can be provided to mechanically fasten the stacked die assembly 100 to a PCB, in which case not every solder ball 150 is necessarily connected by any of the vias 165.

FIGS. 2A-2D illustrate cross-sections of various embodiments of the antenna package 120. The antenna package is a surface mount package comprising one or more RF antennas embedded between layers of a dielectric laminate. The laminate can be of the same type as the laminate substrate 110 of FIG. 1B, for example. Although the antenna package 120 uses the same or similar technology as the laminate substrate 110, isolating one or more RF antennas of the stacked die assembly 100 can provide several advantages.

The antenna package 120 is preferably a land grid array (LGA) package configured to be soldered to the corresponding solder pads 125 on the upper exterior surface of the laminate substrate 110. The antenna package 120 can have an air gap 205 between the package and the substrate 110 such that the antenna package 120 is suspended by a package height H2 above the upper exterior surface of the substrate 110. The air gap 205 acts as a dielectric between the package and the upper exterior surface of the laminate substrate 110, reducing return loss by isolating the antenna package 120. The package height H2 can be selected to reduce or eliminate return loss while maintaining an overall thickness of the stacked die assembly 100. The air gap 205 and package height H2 also contribute to improved RF scan range by reducing surface wave effects on the antenna package.

In certain embodiments, the antenna package 120 can be a BGA package with a greater package height H2 compared with the LGA antenna package 120. In the BGA package embodiment, one or more RF passive devices 130 can be provided underneath the antenna package 120 within the air gap created by the package height H2. The RF passive devices 130 can be mounted directly to the upper exterior surface of the laminate substrate 110, or to an underside of the antenna package 120. See e.g., FIG. 2D. This can allow for greater density of devices on the laminate substrate 110 by positioning passive devices 130 which are electrically connected to one of the antenna packages 120 underneath the corresponding antenna package.

Figures 2A, 2B, 2C, 2D:
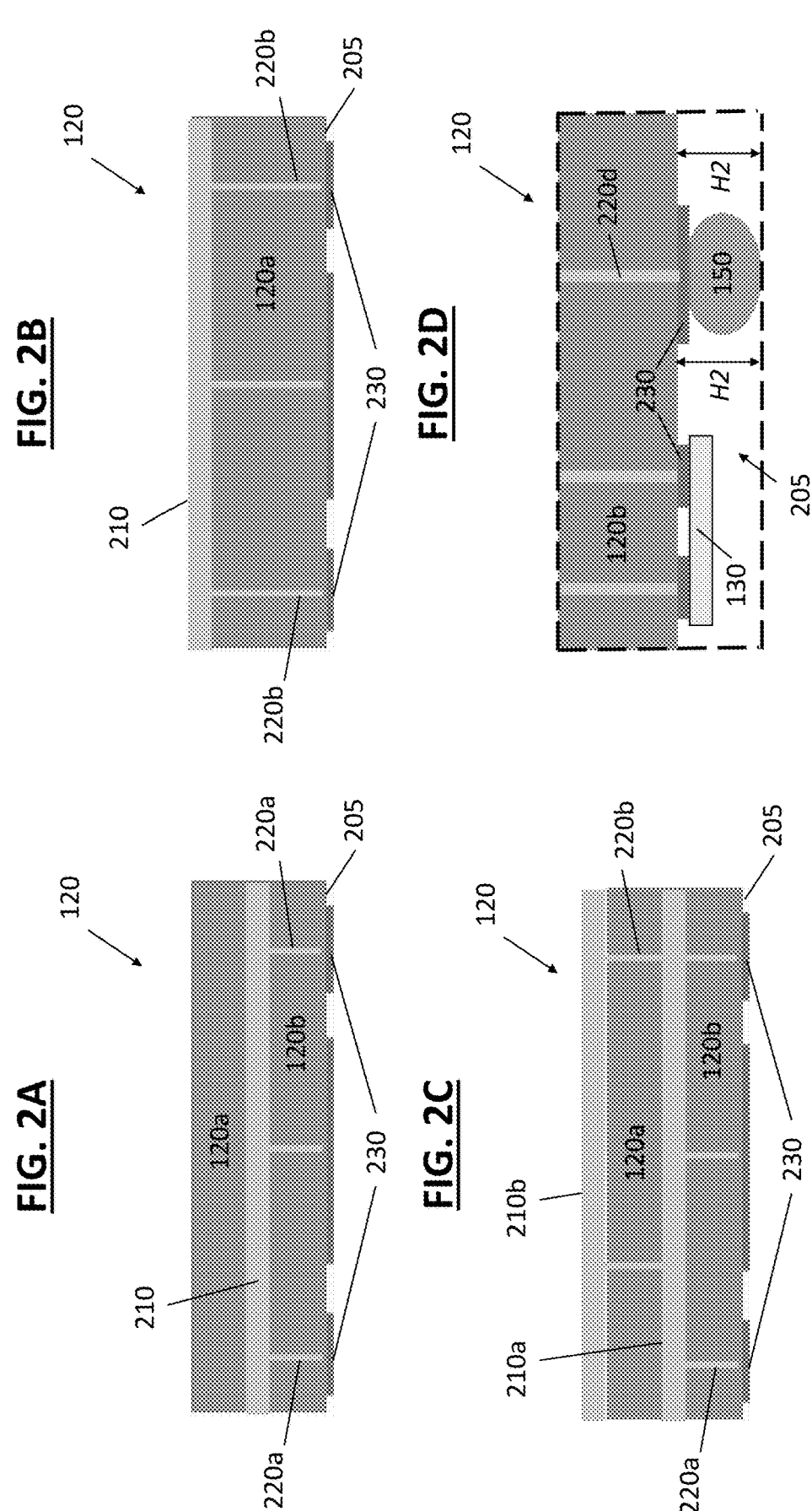
FIGS. 2A-2D are cross-sectional side views of various antenna packages.

The antenna package 120 comprises one or more dielectric laminate layers 120a-120b. A conductive layer including one or more antenna patches 210 is provided above and/or between the dielectric laminate layers 120a-120b. For example, in FIG. 2A, the antenna patch 210 is located between a first dielectric laminate layer 120a and a second dielectric laminate layer 120b such that the conductive layer is connected to a plurality of lands 230 on the underside of the antenna package 120 by one or more blind vias 220 which extend through the second dielectric laminate layer 120b. In certain embodiments, the lands 230 of the LGA antenna package 120 can be replaced with pads for affixing solder balls of a BGA package. Although the embodiment of FIG. 2A is shown with two dielectric laminate layers 120a-120b, the antenna package 120 can include fewer or additional layers as needed. Preferably, the antenna package 120 includes no more than two laminate layers 120a-120b to maintain a relatively thin profile of the antenna package, allowing the antenna patches 210 to radiate freely.

FIG. 2B shows an alternate embodiment of the antenna package 120. Instead of forming the antenna patch 210 between dielectric layers, a conductive layer can be applied over an exterior surface of the first (uppermost) dielectric layer 120a. This embodiment simplifies construction of the antenna package 120, using only a single dielectric layer and one or more through vias 220b. Although additional dielectric layers are not required, the antenna package 120 can include two or more stacked dielectric layers 120a-120b to provide additional package height and streamline manufacturing in volume. The stacked die assembly 100 can also benefit from overmold adjacent to each antenna package 120 to protect the upper surface containing the exposed antenna patch 210. In the illustrated embodiment, however, there may be no molding compound over the upper surface of the laminate substrate 110 and antenna packages 120.

FIG. 2C combines the previous embodiments of the antenna package 120 in a dual-layer antenna configuration. A first conductive layer including a first antenna patch 210a is provided between the first dielectric laminate layer 120a and the second dielectric laminate layer 120b. A second conductive layer including a second antenna patch 210b is applied over the exterior surface of the first dielectric layer 120a. In addition to the first antenna patch 210a and the second antenna patch 210b, each conductive layer can include one or more RF traces communicatively connected by a plurality of blind vias 220a and/or through vias 220b. In certain embodiments, the first conductive layer can include an electrically grounded portion acting as a ground plane for the second antenna patch 210b.

It will be understood by those skilled in the art that alternate embodiments of the antenna package 120 not shown by FIGS. 2A-2D are possible. For example, the conductive layers can include a microstrip antenna, stripline antenna, or another radiating antenna element. In some cases, one or more high frequency RF networks are routed through the antenna package, which can simplify the construction of the laminate substrate 110 and reduce spurious emissions by the stacked die assembly. Each antenna package 120 can be individually tested before it is assembled into the stacked die assembly 100, avoiding wasteful and costly defects in the complete assembly.

Figure 3:
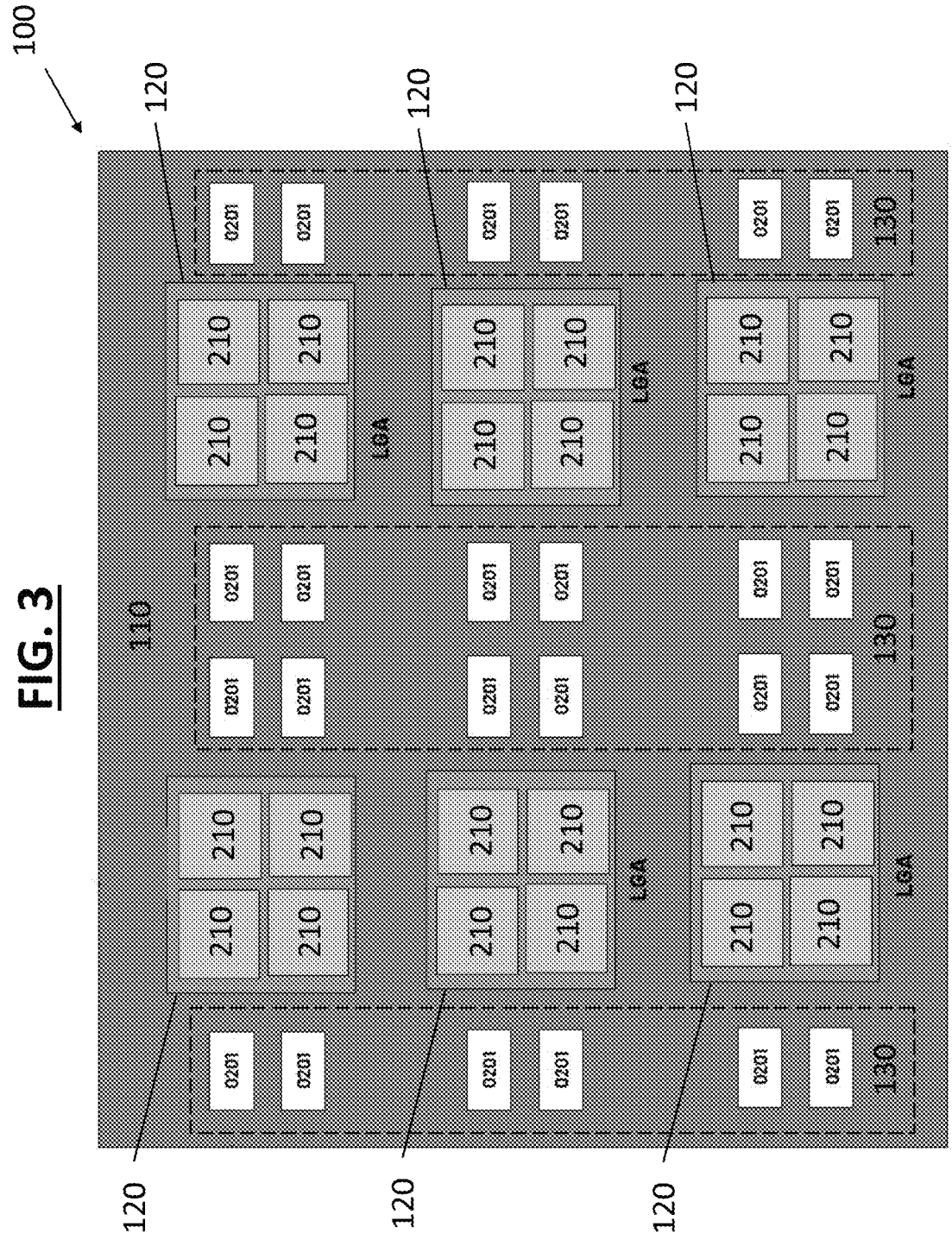
FIG. 3 is a schematic diagram of a layout of a stacked die assembly with several antenna packages.

FIG. 3 is a top plan view of the stacked die assembly 100, illustrating one example of a component layout. A plurality of antenna packages 120, each antenna package including four antenna patches 210, are arranged into two columns on the upper exterior surface of the laminate substrate 110. Various RF passive devices 130 are arranged into three columns adjacent to the antenna packages 120. Each passive device 130 can be connected to a corresponding antenna patch 210 of the antenna packages 120. Separating the components into discrete columns allows the antenna packages 120 and RF passive devices 130 to be connected more easily within the various layers of the laminate substrate 110, and can help to reduce RF noise such as crossover leakage.

Figures 4A, 4B:
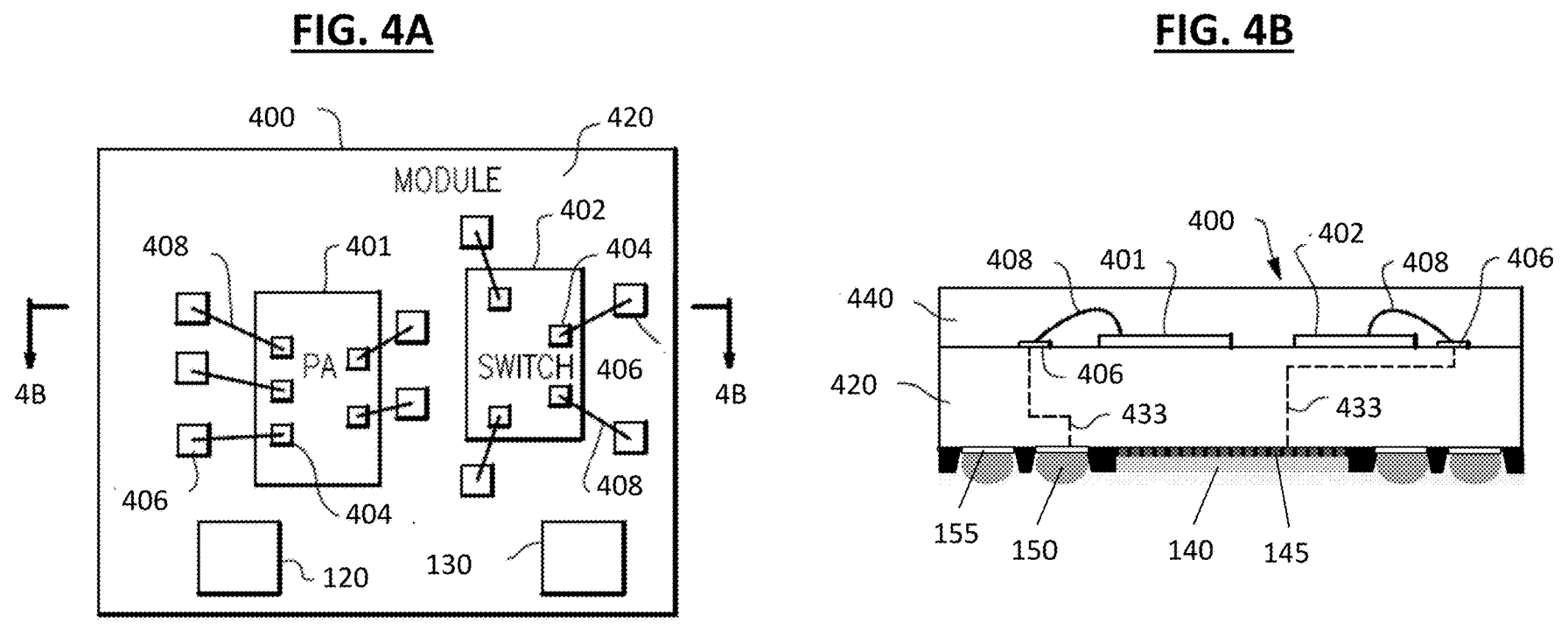

FIG. 4A is a schematic diagram of a packaged module 400, which can be another embodiment of the stacked die assembly 100 as described herein. FIG. 4B is a schematic diagram of a cross-section of the packaged module 400 taken along the lines 4B-4B.

The packaged module 400 can include various active and passive devices, including a power amplifier die 401, a supply switch die 402, surface mount devices (including an antenna package 120 and RF passive device 130), wirebonds 408, a package substrate 420, and encapsulation structure 440. The package substrate 420 includes pads 406 formed from conductors disposed therein. Additionally, the dies

401, 402 include pads 404, and the wirebonds 408 have been used to connect the pads 404 of the dies 401, 402 to the pads 406 of the package substrate 420.

The power amplifier die 401 and the supply switch die 402 are implemented in accordance with one or more features of the present disclosure. In certain implementations, the supply switch die 402 provides a selected power amplifier supply voltage to the power amplifier die 401. The power amplifier die 401 or the supply switch die 402 can be a flip chip die 140 mounted to either side of the package substrate 420.

In certain implementations, the power amplifier die 401 the supply switch die 402, and/or flip chip die 140 are manufactured using different processing technologies. In one example, the power amplifier die 401 is manufactured using a heterojunction bipolar transistor (HBT) process, and the supply switch die 402 is manufactured using a silicon process. In other implementations, the flip chip die 140 can be manufactured by a silicon-on-insulator (SOI) or gallium arsenide (GaAs) process.

As shown in FIG. 4B, the packaged module 400 is shown to include a plurality of contact pads 155 and pillar bumps 145 disposed on the side of the packaged module 400 opposite the side used to mount the dies 401, 402 and passive devices 120, 130. Configuring the packaged module 400 in this manner can aid in connecting the packaged module 400 to a circuit board such as a phone board of a wireless device. The example contact pads 155 can be configured to provide RF signals, bias signals, power low voltage(s) and/or power high voltage(s) to the dies 401, 402 and/or passive devices 120, 130. As shown in FIG. 4B, electrical connections between the contact pads 155 and the die 401 can be facilitated by connections 433 through the package substrate 420. The connections 433 can represent electrical paths formed through the package substrate 420, such as connections associated with vias and conductors of a multilayer laminated package substrate.

In some embodiments, the packaged module 400 can also include one or more packaging structures to, for example, provide protection and/or facilitate handling of the packaged module 400. Such a packaging structure can include a partial overmold or encapsulation structure 440 formed over the packaging substrate 420 and the components and die(s) disposed thereon.

It will be understood that although the packaged module 400 is described in the context of electrical connections based on wirebonds, one or more features of the present disclosure can also be implemented in other packaging configurations, including, for example, flip chip configurations.

The packaged module 400 as discussed herein can allow for more flexible manufacturing methods because each antenna package 120 and passive device is interchangeable, and can be among the last components soldered to the substrate 110. In some cases, each antenna package 120 can be individually tested before it is soldered to the package substrate 420. In other cases, defective antenna packages can be identified by batch testing. Defects in the assembled packaged module 400 can also be identified and corrected due to the modular nature of the antenna packages 120, providing higher manufacturing yields.

Applications

Some of the embodiments described above have provided examples in connection with mobile devices. However, the principles and advantages of the embodiments can be used for any other systems or apparatus including, but not limited to, mobile phones, tablets, base stations, network access points, customer-premises equipment (CPE), laptops, and wearable electronics.

CONCLUSION

Unless the context clearly requires otherwise, throughout the description and the claims, the words "comprise." "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below." and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could." "might." "can," "e.g.," "for example." "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A stacked die assembly, comprising:
a laminate substrate including a layer of conductive traces and a first plurality of laminate layers, the laminate substrate having a first exterior surface and a second exterior surface opposite the first exterior surface;
one or more surface mount antenna packages mounted to the first exterior surface of the laminate substrate, wherein each of the one or more surface mount antenna packages comprise a second plurality of laminate layers, wherein a radio frequency antenna is embedded within the second plurality of laminate layers;
one or more surface mount passive devices mounted to the first exterior surface of the laminate substrate, wherein the one or more surface mount passive devices are horizontally adjacent to the one or more surface mount antenna packages;
a flip chip semiconductor die mounted to the second exterior surface of the laminate substrate;
a plurality of solder balls provided on the second exterior surface of the laminate substrate for mounting the stacked die assembly; and
an overmold provided on the second exterior surface of the laminate substrate such that the overmold envelops a periphery of the flip chip die and the plurality of solder balls;
wherein the flip chip die, the radio frequency antenna, the one or more surface mount passive devices, and the plurality of solder balls are connected by the layer of conductive traces and a plurality of vias.

2. The stacked die assembly of claim 1, wherein the first plurality of laminate layers comprises a greater number of laminate layers than those of the second plurality of laminate layers, and wherein the laminate substrate does not include a radio frequency antenna.

3. The stacked die assembly of claim 1, wherein the surface mount antenna packages are land grid array or ball grid array packages.

4. The stacked die assembly of claim 3, wherein an air gap is formed between each antenna package and the laminate substrate.

5. The stacked die assembly of claim 4, wherein one or more of the surface mount passive devices are provided within the air gap underneath each antenna package.

6. The stacked die assembly of claim 1, wherein the flip chip semiconductor die is mounted to the laminate substrate by a copper pillar bump process.

7. The stacked die assembly of claim 6, wherein the flip chip semiconductor die is a silicon-on-insulator (SOI) or gallium arsenide (GaAs) die.

8. The stacked die assembly of claim 1, wherein a periphery of each antenna package is provided with an overmold.

9. The stacked die assembly of claim 1, wherein a surface of the flip chip semiconductor die is exposed to allow for heat transfer.

10. A surface mount antenna package comprising:
a plurality of laminate layers; and a conductive layer comprising a radio frequency antenna embedded within the plurality of laminate layers;
wherein the surface mount antenna package is a ball grid array or land grid array package; and
wherein the radio frequency antenna is a patch antenna connected to solder pads on a lower layer of the plurality of laminate layers by one or more conductive vias.

11. The surface mount antenna package of claim 10, wherein the patch antenna is connected to the solder pads by a plurality of through vias or blind vias.

12. The surface mount antenna package of claim 10, wherein an air gap is formed between two or more of the solder pads.

13. The surface mount antenna package of claim 12, wherein one or more passive devices are provided in the air gap and electrically connected to the patch antenna.

14. The surface mount antenna package of claim 10, further comprising two or more radio frequency antennas separated by a laminate layer of the plurality of laminate layers.

15. The surface mount antenna package of claim 10, wherein the plurality of laminate layers comprises no more than 2 layers.

16. A method of manufacturing a stacked die assembly, comprising:
providing a laminate substrate including a layer of conductive traces and a first plurality of laminate layers, the laminate substrate having a first exterior surface and a second exterior surface opposite the first exterior surface;
soldering a surface mount antenna package onto solder pads of the first exterior surface of the laminate substrate, the antenna package including a radio frequency antenna embedded within a second plurality of laminate layers;
reflow soldering the antenna package and passive devices to the first exterior surface of the laminate substrate;
mounting a flip chip semiconductor die on the second exterior surface of the laminate substrate such that a plurality of copper pillar bumps of the flip chip die are in contact with corresponding solder pads of the laminate substrate;
forming an overmold over the second exterior surface of the laminate substrate such that the overmold envelops a periphery of the flip chip die; and
stripping away a part of the overmold to expose an exterior surface of the flip chip die.

17. The method of claim 16, further comprising stripping away a part of the overmold to expose a plurality of solder pads on a periphery of the second exterior surface of the laminate substrate, wherein stripping away a portion of the overmold is performed by laser ablation or grinding.

18. The method of claim 16, wherein the first plurality of laminate layers comprise 6 or 8 laminate layers and the second plurality of laminate layers comprise 1 or 2 laminate layers.

19. The method of claim 16, further comprising:
screening solder paste onto a plurality of solder pads on the first exterior surface of the laminate substrate; and
soldering one or more surface mount passive devices onto the solder pads of the first exterior surface of the laminate substrate.

20. The method of claim 17, further comprising:
applying a layer of flux over the second exterior surface of the laminate substrate;

screening solder paste onto the plurality of solder pads on the periphery of the second exterior surface of the laminate substrate; and reflow soldering a plurality of solder balls onto the plurality of solder pads on the periphery of the second exterior surface of the laminate substrate.

* * * * *